United States Patent [19]
Furuta et al.

[11] Patent Number: 5,236,867
[45] Date of Patent: Aug. 17, 1993

[54] MANUFACTURING METHOD OF CONTACT HOLE ARRANGEMENT OF A SEMICONDUCTOR DEVICE

[75] Inventors: Takashi Furuta, Takatsuki; Shuichi Nishida, Otsu, both of Japan

[73] Assignee: Matsushita Electronics Corporation, Osaka, Japan

[21] Appl. No.: 822,460

[22] Filed: Jan. 17, 1992

Related U.S. Application Data

[60] Division of Ser. No. 653,158, Feb. 11, 1991, Pat. No. 5,113,234, which is a continuation of Ser. No. 267,283, Nov. 4, 1988.

[30] Foreign Application Priority Data

Nov. 13, 1987 [JP] Japan .................. 62-287901

[51] Int. Cl.$^5$ ............................................. H01L 21/28
[52] U.S. Cl. .................................... 437/189; 437/149; 437/193; 437/195
[58] Field of Search .............. 437/44, 200, 193, 150, 437/162, 149, 154, 41, 189, 195

[56] References Cited

U.S. PATENT DOCUMENTS

| | | | |
|---|---|---|---|
| 3,915,767 | 10/1975 | Welliver | 437/162 |
| 4,332,839 | 6/1982 | Levinstein et al. | 148/DIG. 147 |
| 4,392,150 | 7/1983 | Dourreges | 148/DIG. 147 |
| 4,433,468 | 2/1984 | Kawamata . | |
| 4,477,962 | 10/1984 | Godejahn, Jr. . | |
| 4,512,073 | 4/1985 | Hsu . | |
| 4,888,297 | 12/1989 | Aboelfotoh et al. | 437/162 |
| 4,935,379 | 6/1990 | Toyoshima | 437/44 |

FOREIGN PATENT DOCUMENTS 2075255 11/1981 United Kingdom .

OTHER PUBLICATIONS

"High Speed Bipolar ICs Using Super Self-Aligned Process Technology"; Sakai et al.; Japanese Journal of Applied Physics, vol. 20 (1981) Supplement 20-1, pp. 155-159.

Primary Examiner—T. N. Quach
Attorney, Agent, or Firm—Wenderoth, Lind & Ponack

[57] ABSTRACT

A semiconductor device includes first and second oxide film regions formed on a surface of a semiconductor substrate. A first impurity diffusion region is located at a distance from one of the first and second oxide regions. A second impurity diffusion region is located along the surface of the semiconductor substrate and partially overlaps the first impurity diffusion region. The width of the second impurity diffusion region is greater than that of the first impurity diffusion region. A contact hole is provided extending substantially over the second impurity diffusion region. The contact hole has a first side wall defined by one of the first and second oxide film regions and a second side wall defined by an insulating film. The width of the opening of the contact hole is greater than or equal to the width of the first impurity diffusion region. A conductive film is formed along the bottom portion and along the opposite side walls of the contact hole. A wiring layer is provided connected to the conductive film.

4 Claims, 1 Drawing Sheet

MANUFACTURING METHOD OF CONTACT HOLE ARRANGEMENT OF A SEMICONDUCTOR DEVICE

CROSS-REFERENCE TO RELATED APPLICATIONS

This application is a divisional application of application Ser. No. 07/653,158, filed Feb. 11, 1991, U.S. Pat. No. 5,113,234 which was a continuation application of abandoned application Ser. No. 07/267,283, filed Nov. 4, 1988.

BACKGROUND OF THE INVENTION

Field of the Invention

This invention relates to a semiconductor device manufacturing method for providing a stable connection between an impurity diffusion region formed in a semiconductor substrate and a wiring layer formed on the surface of an insulation film on the semiconductor substrate via a contact hole formed in the insulation film.

Description of the Related Art

In a semiconductor device, generally, oxide film regions are selectively formed on the surface of a semiconductor substrate for separating devices from one another along the surface of the substrate. At least one impurity diffusion region is formed in the semiconductor substrate between such oxide film regions. An insulation film is then formed on the semiconductor substrate, and a wiring layer is formed on this insulation film. The impurity diffusion region and wiring layer are connected together by way of a contact hole formed in the insulation film.

When the width of the contact hole is greater than the width of the impurity diffusion region, a portion of the contact hole extends to the oxide film which is adjacent to the impurity diffusion region. As a result, the wiring material formed in the contact hole directly contacts the semiconductor substrate, causing a so-called current leak. To avoid this problem, the width of the contact hole is usually set to be smaller than the width of the impurity diffusion region. Additionally, the forming position of the contact hole is set at a position remote from the oxide films.

Meanwhile, as integration of the semiconductor integrated circuit increases and the semiconductor elements become smaller, the device areas defined by the oxide films becomes smaller, and the area of the impurity diffusion regions formed therein also tend to be smaller. As a result, the width of the contact hole is becoming smaller.

When the area of the contact hole becomes smaller, the contact resistance between the impurity diffusion region and wiring layer increases. Additionally, the smaller the area of the impurity diffusion region, the shorter the distance between the periphery of the contact hole and the edge of the oxide film. As a consequence, the patterning allowance between the impurity diffusion region and the contact hole decreases, and positioning of the two becomes extremely difficult.

SUMMARY OF THE INVENTION

It is hence a primary object of this invention to provide a semiconductor device and manufacturing method thereof capable of sufficiently widening the contact area between the wiring layer and the impurity diffusion region and thus decreasing the contact resistance, even if the area between the oxide films is small and the area of the impurity diffusion region formed therein is small.

It is a second object of this invention to provide a semiconductor device and manufacturing method thereof capable of facilitating the positioning of the impurity diffusion region and contact hole by increasing the patterning allowance therebetween.

It is a third object of this invention to provide a semiconductor device and manufacturing method thereof capable of patterning the contact hole itself quite easily, so that the reliability of connection between the impurity diffusion region and wiring layer may be enhanced.

The features and other objects of this invention will be better understood and appreciated from the following detailed description taken in conjunction with the drawings.

DETAILED DESCRIPTION OF THE INVENTION

One of the embodiments of the present invention is described below with reference to the cross sectional views of the manufacturing stages shown in FIGS. 1 and 2.

Figure 1:
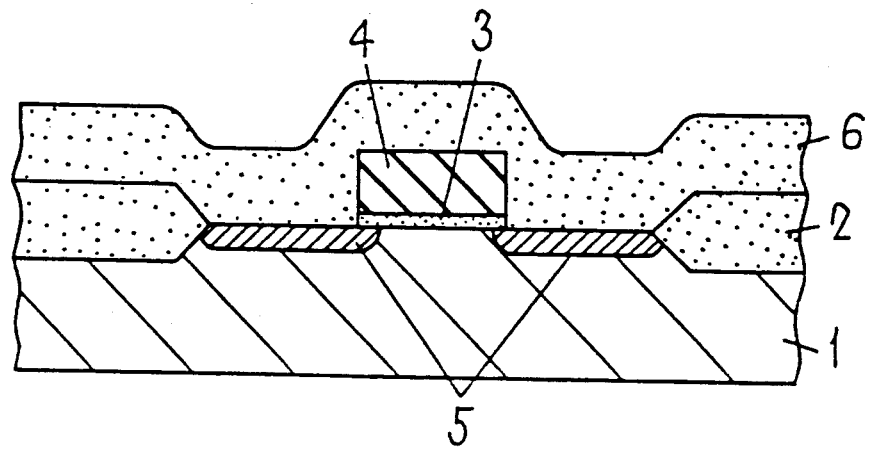
FIG. 1 is a sectional view of a stage of forming a first insulation film of a semiconductor device in one of the embodiments of the present invention.
Figure 2:
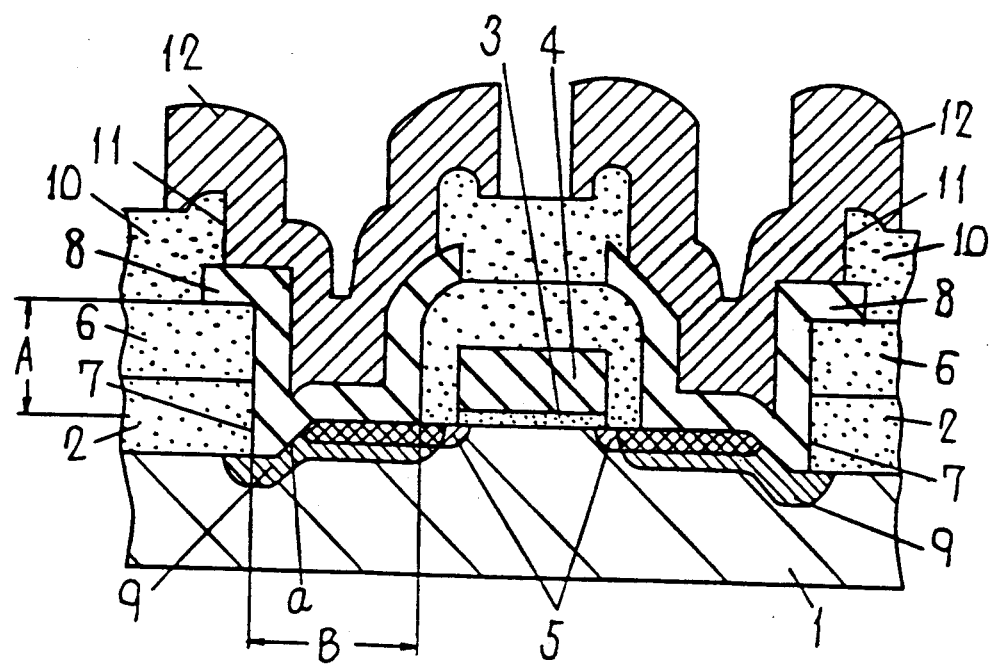
FIG. 2 is a sectional view of a stage of forming a wiring layer of the semiconductor device in the same embodiment.

FIGS. 1 and 2 show a transistor component, including it peripheral portion, of a MOS type semiconductor device.

Predetermined portions of the surface of a P-type silicon substrate 1 are selectively oxidized to form oxide films 2, 2 for separating devices from one another along the surface of the substrate 1. For descriptive purposes, the oxide films 2, 2 define a first direction therebetween. Then, using conventional techniques, a gate oxide film 3 and a gate electrode 4 are centrally formed between the oxide films 2, 2. Subsequently, using a self-alignment technique and the gate electrode 4 as a mask, an impurity is diffused on the surface of the P-type silicon substrate 1, and first N+ diffusion regions 5 are formed as drain and source regions. Again for descriptive purposes, the diffusion regions 5 extend a first distance in the first direction. Furthermore, a first insulation film 6 is formed entire surface of the P-type silicon substrate 1. In this way, the basic structure of an N-channel type MOS transistor is completed.

Next, as shown in FIG. 2, first contact holes 7 are formed in the first insulation film 6. A portion of the periphery of the first contact holes 7 extends beyond the outer ends of the first N+ diffusion regions. The first contact holes 7 each have a width (extending a second distance in the first direction) which is sufficient to eliminate the inner edges of the oxide films 2 which are adjacent to the first N+ diffusion regions 5. Therefore, at this stage, portions of the P-type silicon substrate 1 are directly exposed in the first contact holes 7. Conductive films 8 are then formed on the bottom, inner wall and upper peripheral portions of the first contact holes 7. As the conductive film 8, polysilicon or polyside may be used. Through each conductive film 8, phosphorus ions (P+) are implanted at an accelerating voltage of 100 keV and at a dosage of $1 \times 10^{/}$/cm$^2$, and further, by performing heat treatment for activation, second N+ diffusion regions 9 are formed in the P-type silicon substrate 1. The second N+ diffusion regions 9 extends a third distance in the first direction from beneath the oxide films 2 to almost the gate electrode 4. Therefore, the second N+ diffusion regions 9 are formed in the portion of the P-type silicon substrate 1 which was directly exposed to the first contact holes 7. Thus, each conductive film 8 makes an ohmic contact with the first and second N+ diffusion regions 5, 9. As is clear from FIG. 2, the width of the second N+ diffusion region 9 (i.e. the third distance) is greater than the widths of the first N+ diffusion region 5 and contact hole 7 (i.e. the first and the second distances). As shown, the first and second N+ diffusion regions 5 and 9 partly overlap each other to form a single N+ diffusion region. This ohmic contact area exists over almost the entire surface of the first and second N+ diffusion regions 5, 9.

Next, a second insulation film 10 is formed on the surface of the first insulation film 6 and second contact holes 11 are formed in the second insulation film 10 to connect the conductive films 8 to wiring layers 12 which are to be formed on the second insulation film 10. The second contact holes 11 each extend a fourth distance in the first direction and are large enough so that the inner circumference thereof approaches the outermost periphery of each conductive film 8 as shown. As is clear from FIG. 2, the width of the second contact hole 11 (i.e. the fourth distance) is greater than the width of the first N+ diffusion region 5 (i.e. the second distance).

Finally, wiring layers 12 of aluminum or the like are formed on the surface of the second insulation film 10 and inside the second contact holes 11 as shown. The wiring layer is then patterned as required. As a result, the first and second N+ diffusion regions 5, 9 are connected to the wiring layers 2 by way or the conductive films 8.

As described herein, according to this embodiment, the first contact hole 7 is sufficiently wide so as to project from the first N+ diffusion region 5 to the partially removed edge of the oxide film 2. In other words, it is possible to form a sufficiently wide first contact hole without being confined by the first N+ diffusion region 4 or the edge of the oxide film 2. Still more, the area of ohmic contact is sufficiently wide because the conductive film 8 is formed in the first contact hole 7 and this conductive film 8 is brought into contact with the diffusion region. Therefore, the contact resistance between the diffusion region and the wiring layer may be sufficiently reduced. Moreover, the conductive film 8 is formed in the first contact hole 7, and then the second N+ diffusion region 9 is formed in the P-type silicon substrate 1 through the conductive film 8. It is hence possible to form a diffusion region having a proper size and position of the first contact hole 7. Therefore, as for positioning of the first N+ diffusion region 5 and first contact hole 7, a sufficiently wide mask matching allowance is provided as compared with the prior art, thereby enhancing the productivity of semiconductor device.

Additionally, since the first contact hole 7 is formed within the first insulation film 6, the ratio of the width to depth (A/B in FIG. 2) of the first contact hole may be reduced. As a result, formation of the first contact hole 7 is facilitated, and formation related failures of the first contact hole 7 maybe reduced. Still more, by forming the upper end part of the conductive film 8 above the first insulation film 6, the second contact hole 11, which is larger than the first contact hole 7, is formed in the second insulation film 10 on the conductive film 8, so that the formation of the second contact hole 11 is facilitated and the ohmic contact between the conductive film 8 and the wiring layers 12 becomes extremely stable.

As the conductive film 8, polysilicon and polycide can be used. When polycide is used, the contact resistance between the diffusion region and the wiring layer may be significantly decreased. In this embodiment, the P-type silicon substrate is used as the semiconductor substrate, but is it also possible to use an N-type silicon substrate as the semiconductor substrate, and to form P+ diffusion regions as the source and drain regions.

We claim:

1. A method of manufacturing a semiconductor device comprising:
    a first step of forming first and second oxide film regions respectively at first and second locations on a surface of a semiconductor substrate of a first type of conductivity, said first and second oxide film regions defining a first direction therebetween;
    a second step of forming a first impurity diffusion region of a second type of conductivity extending a first distance in said first direction between said first and second oxide film regions along said surface of said semiconductor substrate and spaced from said second oxide film region and directly adjacent said first oxide film region;
    a third step of forming a first insulation film on said surface of said semiconductor substrate to cover at least said first oxide film region and said first impurity diffusion region;
    a fourth step of forming a contact hole, which extends a second distance in said first direction in said first insulation film, by removing a continuous portion of said insulation film which extends over a portion of said first impurity diffusion region and an adjacent edge portion of said first oxide film region, and by removing said adjacent edge portion of said first oxide film region;
    a fifth step of forming a conductive film on at least a bottom surface of said contact hole, said bottom surface extending said second distance in said first direction;
    a sixth step of forming a second impurity diffusion region, extending a third distance in said first direction along said surface of said semiconductor substrate and partially overlapping said first impurity diffusion region, by introducing impurities of the second type of conductivity into said semiconductor substrate through said conductive film, said third distance being greater than each of said first and second distances; and,
    a seventh step of forming a wiring layer in contact with said conductive layer.

2. A method as recited in claim 1, wherein said fifth step further includes forming said conductive film continuously on opposite inner side walls of said contact hole and on a portion of an upper surface of said first insulation film, and wherein said method further comprises, prior to said seventh step, the steps of:
    forming a second insulation film on said conductive film and said first insulation layer; and, forming a second contact hole, which extends a fourth distance in said first direction in said second insulation film, by removing a continuous portion of said second insulation film located over said first contact hole, said fourth distance being greater than said second distance.

3. A method as recited in claim 2, comprising using polysilicon or polycide as said conductive film.

4. A method as recited in claim 1, comprising using polysilicon or polycide as said conductive film.

* * * * *